US012690358B2

(12) United States Patent
Wu et al.

(10) Patent No.: US 12,690,358 B2
(45) Date of Patent: Jul. 21, 2026

(54) ELECTRONIC DEVICE

(71) Applicant: InnoLux Corporation, Miao-Li County (TW)

(72) Inventors: Yuan-Lin Wu, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 478 days.

(21) Appl. No.: 18/224,575

(22) Filed: Jul. 21, 2023

(65) Prior Publication Data

US 2024/0074281 A1      Feb. 29, 2024

(30) Foreign Application Priority Data

Aug. 24, 2022    (CN) .......................... 202211021810.6

(51) Int. Cl.
*H10K 59/40* (2023.01)
*G06F 3/041* (2006.01)
(Continued)

(52) U.S. Cl.
CPC .......... *H10K 59/40* (2023.02); *G06F 3/0412* (2013.01); *H10K 59/122* (2023.02); *H10K 59/8731* (2023.02); *G06F 3/0443* (2019.05); *G06F 3/0446* (2019.05); *G06F 2203/04102* (2013.01); *G06F 2203/04111* (2013.01); *G06F 2203/04112* (2013.01); *H10K 59/131* (2023.02); *H10K 77/111* (2023.02); *H10K 2102/311* (2023.02)

(58) Field of Classification Search
CPC .. H10K 59/40; H10K 59/122; H10K 59/8731; H10K 59/131; H10K 77/111; H10K 2102/311; G06F 3/0412; G06F 3/0443; G06F 3/0446; G06F 2203/04102; G06F 2203/04111; G06F 2203/04112; G09F 9/301; G09F 9/33; G09F 9/335; H10H 29/142
See application file for complete search history.

(56) References Cited

U.S. PATENT DOCUMENTS 11,609,671 B2      3/2023  Chu
2021/0192983 A1*   6/2021  Sui ....................... H10K 59/131
(Continued)

FOREIGN PATENT DOCUMENTS

CN          111968522 A          11/2020
CN          113451379 A          9/2021
CN          114527889 A          5/2022

*Primary Examiner* — William B Partridge
*Assistant Examiner* — Chevy J Boegel
(74) *Attorney, Agent, or Firm* — Winston Hsu

(57) ABSTRACT

A display device includes a patterned substrate, a plurality of light emitting unit, a first insulating layer and a sensing layer. The patterned substrate has a plurality of island structures and a plurality of bridge structures, and at least one bridge structure connects two adjacent island structures. At least one light emitting unit is disposed on one of the two adjacent island structures. The first insulating layer is disposed on the light emitting units. The sensing layer is disposed on the first insulating layer and has a mesh unit, the mesh unit has a mesh frame and an opening, and the at least one light emitting unit is disposed in the opening.

16 Claims, 10 Drawing Sheets

(51) Int. Cl.

| | | |
|---|---|---|
| *G06F 3/044* | (2006.01) | |
| *H10K 59/122* | (2023.01) | |
| *H10K 59/131* | (2023.01) | |
| *H10K 59/80* | (2023.01) | |
| *H10K 77/10* | (2023.01) | |
| *H10K 102/00* | (2023.01) | |

(56) References Cited

U.S. PATENT DOCUMENTS

| | | |
|---|---|---|
| 2022/0085130 A1 | 3/2022 | Zhai |
| 2022/0164066 A1* | 5/2022 | Chu ........................ H10K 59/60 |

\* cited by examiner

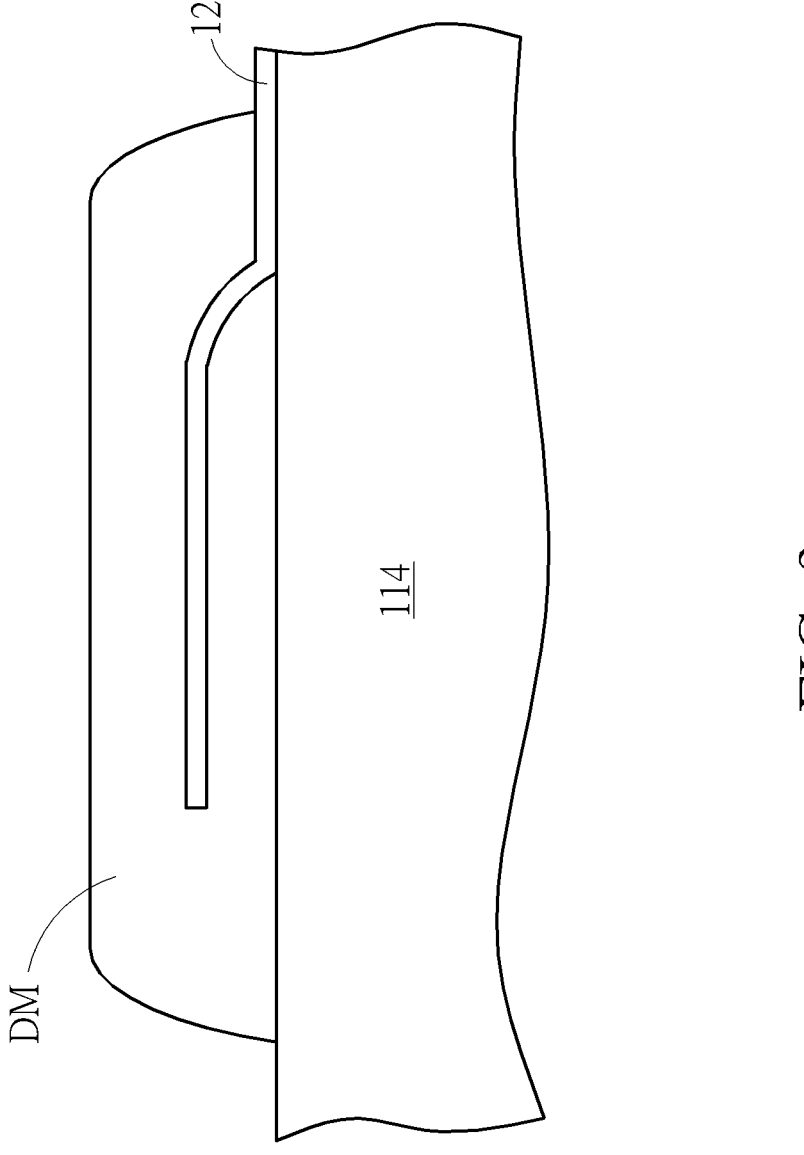
FIG. 3
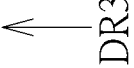
DR3

ELECTRONIC DEVICE

BACKGROUND OF THE DISCLOSURE

1. Field of the Disclosure

The present disclosure relates to an electronic device, and more particular to a deformable display device.

2. Description of the Prior Art

Deformable display devices can be attached to curved surfaces having different shapes, thus deformable display devices can have various applications. For example, the deformable display device may be attached to a vehicle panel as a vehicle display or sensor, or may be attached to human skin as a wearable display or sensor. However, during the deformation of the display device, cracks or fractures may form in the substrate or in the layers above the substrate, thus decreasing the reliability of the device. Therefore, how to reduce the possibility of forming cracks or fractures to improve the reliability of deformable display devices is still an important issue in this field.

SUMMARY OF THE DISCLOSURE

One of the objects of the present disclosure is to provide an electronic device.

In some embodiments, the present disclosure provides a display device including a patterned substrate, a plurality of light emitting units, a first insulating layer and a sensing layer. The patterned substrate has a plurality of island structures and a plurality of bridge structures, and at least one of the bridge structures connects two adjacent ones of the island structures. At least one of the light emitting units is disposed on one of the two adjacent ones of the island structures. The first insulating layer is disposed on the light emitting units. The sensing layer is disposed on the first insulating layer and has a mesh unit, the mesh unit has a mesh frame and an opening, and the at least one of the light emitting units is disposed in the opening.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 3 is an enlarged cross-sectional view schematic diagram of the dam according to the first embodiment of the present disclosure.

DETAILED DESCRIPTION

Figure 1:
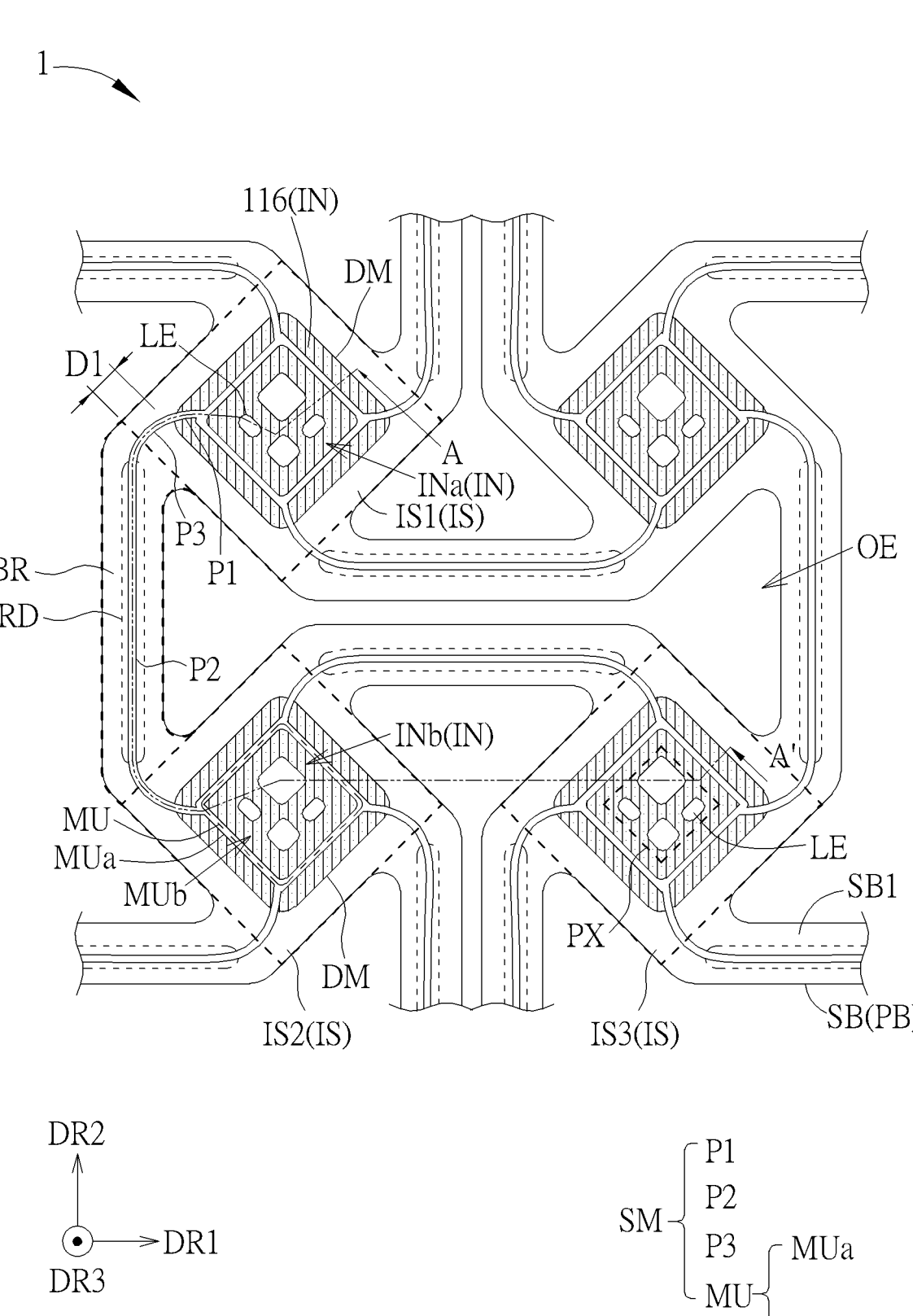
FIG. 1 is a partially enlarged top view schematic diagram of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device or display device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . .".

The directional terms mentioned in this document, such as "up", "down", "front", "back", "left", "right", etc., are only directions referring to the drawings. Therefore, the directional terms are used for illustration, not to limit the present disclosure. In the drawings, each drawing shows the general characteristics of methods, structures and/or materials used in specific embodiments. However, these drawings should not be interpreted as defining or limiting the scope or nature covered by these embodiments. For example, the relative size, thickness and position of each layer, region and/or structure may be reduced or enlarged for clarity.

It should be understood that when a component or layer is referred to as being "on", "disposed on" or "connected to" another component or layer, it may be directly on or directly connected to the other component or layer, or intervening components or layers may be presented (indirect condition). In contrast, when a component is referred to as being "directly on", "directly disposed on" or "directly connected to" another component or layer, there are no intervening components or layers presented. In addition, the arrangement relationship between different components may be interpreted according to the contents of the drawings.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The electrical connection can be direct electrical connection or indirect electrical connection. The electrical connection between two components can be achieved by direct contact in order to transmit electrical signals, and there may be no other components between them. The electrical connection between two components can also be bridged by the component between them in order to transmit electrical signals. Electrical connection can also be called coupling.

Although terms such as first, second, third, etc., may be used to describe diverse constituent components, such constituent components are not limited by the terms. The terms are used only to discriminate a constituent component from other constituent components in the specification. The claims may not use the same terms, but instead may use the terms first, second, third, etc. with respect to the order in which a component is claimed. Accordingly, in the following description, a first constituent component may be a second constituent component in a claim.

It should be noted that the technical features in different embodiments described in the following can be replaced, recombined, or mixed with one another to constitute another embodiment without departing from the spirit of the present disclosure.

The comparison of thicknesses, areas and widths between different components in the following text can be conducted by optical microscope (OM), scanning electron microscope (SEM) and other suitable instruments, and can be compared using the same photo or more than one photo.

The electronic device of the present disclosure may include a display device, a backlight device, an antenna device, a sensing device or a tiled device, but not limited herein. The electronic device may include a bendable, flexible or rollable electronic device and/or display device. The display device may include a non-self-emissive display device or a self-emissive display device, but not limited herein. The display device may include, for example, liquid crystal, light emitting diodes, a fluorescence material, phosphors, quantum dots (QD), other suitable display media, or combinations of the above. The antenna device may include a liquid crystal antenna device or an antenna device without liquid crystal, and the sensing device may include a sensing device used for sensing capacitance, light, heat, or ultrasonic waves, but not limited herein.

The electronic device may include electronic components, passive components and active components. The electronic components may for example include capacitors, resistors, inductors, diodes, etc. The diodes may include light-emitting diodes or photodiodes, but not limited herein. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LEDs), but not limited herein. The tiled device may be, for example, a display tiled device or an antenna tiled device, but not limited herein. It should be noted that the electronic device and the display device may be any arrangement and combination of the above, but not limited herein.

In addition, the appearances of the electronic device and the display device can be rectangular, circular, polygonal, shapes with curved edges or other suitable shapes. The electronic device and display device may have peripheral systems such as driving systems, control systems, light source systems, . . . to support display devices, antenna devices, wearable devices (including augmented reality or virtual reality devices, for example), vehicle-mounted devices (including automobile windshields, for example) or tiled devices.

Figure 2:
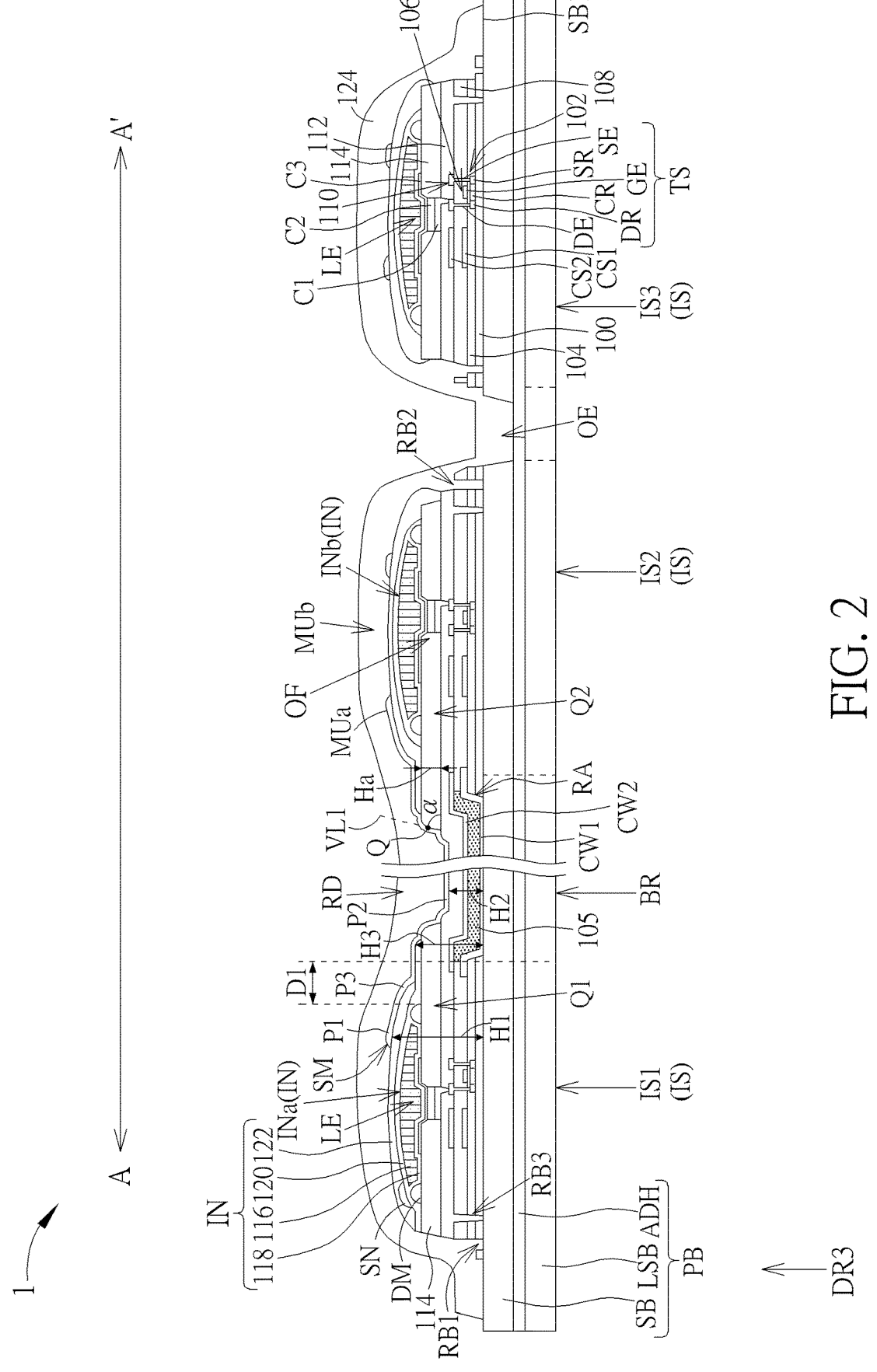
FIG. 2 is a cross-sectional view schematic diagram of the electronic device corresponding to the line A-A' in FIG. 1 of the first embodiment of the present disclosure.

A direction DR1, a direction DR2 and a direction DR3 are labeled in the following drawings. The direction DR3 may be a normal direction or a top-view direction. As shown in FIG. 1 and FIG. 2, the direction DR3 may be perpendicular to an upper surface SB1 of a substrate SB. The direction DR1 and the direction DR2 may be horizontal directions and perpendicular to the direction DR3. As shown in FIG. 1, the direction DR1 and the direction DR2 may be parallel to the upper surface SB1 of the substrate SB, and the direction DR1 may be perpendicular to the direction DR2. The following drawings may describe the spatial relationship of structures according the direction DR1, the direction DR2 and the direction DR3.

Please refer to FIG. 1 and FIG. 2. FIG. 1 is a partially enlarged top view schematic diagram of an electronic device according to a first embodiment of the present disclosure. FIG. 2 is a cross-sectional view schematic diagram of the electronic device corresponding to the line A-A' in FIG. 1 of the first embodiment of the present disclosure. In order to simplify the drawings, FIG. 1 only shows a portion of layers and components of the electronic device, and the detailed structure of the electronic device can refer to FIG. 2, but it is not limited thereto.

In the following embodiments, the display device is taken as an example to explain the electronic device, but not limited thereto. As shown in FIG. 2, the electronic device 1 may include a patterned substrate PB, and the patterned substrate PB may include at least one patterned layer. For example, the patterned substrate PB may include a substrate SB, an adhesive layer ADH and a substrate LSB, and the substrate SB is patterned, but not limited thereto. The substrate SB may be disposed on the substrate LSB, the adhesive layer ADH may be disposed between the substrate SB and the substrate LSB, and the substrate LSB may be adhered to the surface of the substrate SB through the adhesive layer ADH, but not limited thereto.

The patterned substrate PB and the substrate LSB and the substrate SB in the patterned substrate PB may include deformable substrates, which may be flexed, curved, bent, stretched or deformed in any other way, but not limited thereto. In some embodiments, the patterned substrate PB and the substrates LSB and SB in the patterned substrate PB may for example be stretchable substrates, but not limited thereto.

Stretching an object can include stretching the object in two-dimensional or in three-dimensional. The material of the deformable substrate may include polyimide (PI), polycarbonate (PC), polyethylene terephthalate (PET), other suitable materials, or combinations of the above, but not limited thereto. In some embodiments, the substrate SB may include two polyimide layers and an oxide layer disposed between the two polyimide layers, but not limited thereto.

The patterned substrate PB may include a plurality of island structures IS. The island structures IS may be configured to provide electronic components, active components, passive components, or combinations thereof on the island structures IS, but not limited thereto. For example (e.g., FIG. 2), the light-emitting units and the channel regions of the thin-film transistors may be disposed on the island structures IS, but not limited thereto.

As shown in FIG. 1, an island structure IS1 may be adjacent to an island structure IS2 in the direction DR2. In the present disclosure, when the island structure IS1 is adjacent to the island structure IS2, it means that there is no other island structure is disposed between the island structure IS1 and the island structure IS2. In addition, the island structure IS1 can still be regarded as adjacent to the island structure IS2 when other components are disposed between the island structure IS1 and the island structure IS2, but no other island structure is disposed between the island structure IS1 and the island structure IS2. The above definitions of two adjacent identical components can also be used for the description of other adjacent components in the present invention.

The patterned substrate PB may include a plurality of bridge structures BR, and at least one of the bridge structures BR may connect two adjacent island structures IS of the plurality of island structures IS. As shown in FIG. 1, at least one bridge structure BR may be disposed between and connect the island structure IS1 and the island structure IS2, but not limited thereto. In addition, the patterned substrate PB may include a plurality of openings OE, and at least some of the openings OE may be surrounded by island structures IS and bridge structures BR. As shown in FIG. 2, the opening OE may pass through at least a portion of the substrate SB.

The at least one of the bridge structures BR of the present disclosure can be deformed to change the distance between the adjacent island structures IS to which it is connected. For example, the at least one of the bridge structures BR is stretchable. For example, when the electronic device 1 is deformed (e.g., stretched), the bridge structure BR can be deformed and the size (e.g., length) of the bridge structure BR can be changed, thus changing the distance between adjacent island structures IS. Alternatively, the bridge structures BR with different sizes may be created by designing the patterns of openings, thereby changing the distance between adjacent island structures IS.

In addition, the number of layers disposed in and/or on the island structures IS may be greater than the number of layers disposed in and/or on the bridge structures BR, or the thickness of the stack disposed in and/or on the island structures IS may be greater than the thickness of the stack disposed in and/or on the bridge structures BR.

In the present disclosure, the thickness may be the maximum value measured in the cross-sectional view. The thicknesses of different components can be measured in the same cross-sectional view having these components. Alternatively, the thicknesses of different components can be measured in multiple cross-sectional views having these components respectively.

As shown in FIG. 2, the electronic device 1 may include a buffer layer 100, a semiconductor layer 102, an insulating layer 104, a conductive layer 106, an insulating layer 108, a conductive layer 110 and an insulating layer 112 sequentially disposed on the substrate SB of the patterned substrate PB along the direction DR3, but not limited thereto. As shown in FIG. 2, one of the transistors TS may be disposed on one of the island structures IS, but the number of transistors TS on the island structure IS is not limited to this.

Taking an island structure IS3 in FIG. 2 as an example, the semiconductor layer 102 may include a channel region CR, a source region SR and a drain region DR of the transistor TS, and the channel region CR may be disposed between the source region SR and the drain region DR. The semiconductor layer 102 may include silicon or metal oxide, such as low temperature polysilicon (LTPS), amorphous silicon (a-Si), low temperature polysilicon oxide (LIFO), indium gallium zinc oxide (IGZO) or combinations thereof, but not limited thereto. The buffer layer 100 may be disposed between the semiconductor layer 102 and the substrate SB. The buffer layer 100 may include an inorganic insulating material, an organic insulating material or a combination thereof, but not limited thereto.

The conductive layer 106 may be disposed on the semiconductor layer 102, and the insulating layer 104 may be disposed between the conductive layer 106 and the semiconductor layer 102. The conductive layer 106 may include a gate electrode GE of the transistor TS correspondingly disposed on the channel region CR of the semiconductor layer 102.

When the gate electrode GE is correspondingly disposed on the channel region CR of the semiconductor layer 102 or the gate electrode GE corresponds to the channel region CR, it can represent that the gate electrode GE overlaps or at least partially overlaps the channel region CR of the semiconductor layer 102 in the top view direction (e.g., the direction DR3) of the electronic device 1, but not limited thereto. The above definition of the term "corresponding" or "corresponding to" can be applied to the embodiments of the present disclosure.

The conductive layer 110 may be disposed on the conductive layer 106, the insulating layer 108 may be disposed between the conductive layer 110 and the conductive layer 106, and the insulating layer 112 may be disposed on the conductive layer 110 and the insulating layer 108. The conductive layer 110 may include a first electrode SE and a second electrode DE of the transistor TS. The first electrode SE may be one of the source electrode and the drain electrode, and the second electrode DE may be the other one of the source electrode and the drain electrode. For example, the first electrode SE may be the source electrode and the second electrode DE may be the drain electrode. The first electrode SE may be filled into a contact hole penetrating through the insulating layer 104 and the insulating layer 108 to electrically connect the source region SR, and the second electrode DE may be filled into another contact hole penetrating through the insulating layer 104 and the insulating layer 108 to electrically connect the drain region DR, but not limited thereto.

The insulating layer 104 and the insulating layer 108 may include inorganic insulating materials, but not limited thereto. The insulating layer 112 may include an organic insulating material, such as polyfluoroalkoxy (PFA), but not limited thereto.

As shown in FIG. 2, the conductive layer 106 may include an electrode CS1 and the conductive layer 110 may include an electrode CS2, and the electrode CS2 may be correspondingly disposed on the electrode CS1. The electrode CS1, the electrode CS2 and a portion of the insulating layer 108 disposed between the electrode CS1 and the electrode CS2 may form a capacitor, but not limited thereto.

As shown in FIG. 2, a portion of the buffer layer 100, a portion of the insulating layer 104 and a portion of the insulating layer 108 disposed on the bridge structure BR can be removed or thinned, and the portion of the buffer layer 100 and the portion of the insulating layer 104 can be removed or thinned to form a recess RA.

The conductive layer 106 may include a conductive wire CW1 and the conductive layer 110 may include a conductive wire CW2, the conductive wire CW2 may be correspondingly disposed on the conductive wire CW1, and the electronic device 1 may include an insulating layer 105 disposed between the conductive wire CW1 and the conductive wire CW2. The conductive wire CW1, the insulating layer 105 and the conductive wire CW2 may be disposed on the bridge structure BR, the conductive wire CW1 and the conductive wire CW2 may extend into the recess RA, and the insulating layer 105 may be disposed in the recess RA. The insulating layer 105 may include an organic insulating material, but not limited thereto.

Since the layer including inorganic insulating material is more easily to be cracked when the layer is deformed, the chance of damage occurred in the structure disposed on the bridge structure BR can be reduced when the bridge structure BR is deformed by removing the buffer layer 100, the insulating layer 104 and the insulating layer 108 including inorganic insulating materials on the bridge structure BR and replacing them with the insulating layer 105 including the organic insulating material.

The electronic device 1 may include some recesses disposed at the edges of the island structures IS, and the recesses may penetrate through at least one of the buffer layer 100, the insulating layer 104 and the insulating layer 108. For example, a recess RB1 may be disposed at the edge of the island structure IS1 and penetrate through the buffer layer 100, and a recess RB2 may be disposed at the edge of the island structure IS2 and penetrate through the buffer layer 100, the insulating layer 104 and the insulating layer 108, but not limited thereto.

For example, a recess RB3 may be disposed at the edge of the island structure IS1 and penetrate through the buffer layer 100, the insulating layer 104 and the insulating layer 108, and the insulating layer 112 may be filled in the recess RB3. When cracks are generated at the edge of the island structure IS when the electronic device 1 is deformed, the chances of the cracks extending further into the island structure IS can be reduced by forming the recess RB1, the recess RB2 and the recess RB3.

The electronic device 1 may include a plurality of electronic components disposed on the island structures IS. In some embodiments, the electronic components may include a plurality of light emitting units LE, but not limited thereto. In some embodiments, the electronic components may include light emitting units, sensors, diodes, other suitable components or combinations of the above components, but not limited thereto. Hereinafter, the structure of the light emitting unit LE will be described by taking the example that the light emitting unit LE includes an organic light emitting diode, but the present disclosure is not limited thereto.

The electronic device 1 may include an insulating layer 114 disposed on the insulating layer 112. The insulating layer 114 may be a pixel defining layer (PDL) and may include a plurality of openings OF, and the light emitting units LE may be disposed in the openings OF. As shown in FIG. 2, one of the light emitting units LE may be disposed in one of the openings OF, but not limited thereto. The insulating layer 114 may include an organic insulating material, but is not limited thereto.

Taking the island structure IS3 in FIG. 2 as an example, the light emitting unit LE may include an electrode C1, a light emitting layer C2 and an electrode C3 disposed in the opening OF, but not limited thereto. The electrode C1 may be disposed on the insulating layer 112, the electrode C3 may be disposed on the electrode C1, and the light emitting layer C2 may be disposed between the electrode C1 and the electrode C3 and electrically connected to the electrode C1 and the electrode C3. The electrode C1 can be electrically connected to the second electrode DE through a through hole in the insulating layer 112. The electrode C3 may be disposed in the opening OF and may extend to the surface of the insulating layer 114 adjacent to the opening OF.

The light emitting layer C2 may include organic light emitting materials, quantum dot light emitting materials, other suitable light emitting materials or combinations of the above light emitting materials, but not limited thereto. In some embodiments, the light emitting layer C2 may emit blue light, green light, red light or light with other colors, but not limited thereto.

The conductive layer 106, the conductive layer 110, the electrode C1 and the electrode C3 may include conductive materials, and the conductive materials may include metal or transparent conductive materials, but not limited thereto. In some embodiments, the conductive layer 106, the conductive layer 110 and the electrode C1 may include metal, but not limited thereto. In some embodiments, the electrode C3 may include a transparent conductive material, but not limited thereto.

At least one of the light emitting units LE can be disposed on one of the two adjacent island structures IS. As shown in FIG. 1, multiple light emitting units LE can be disposed on one island structure IS, and these light emitting units LE can emit lights of the same or different colors and form a pixel PX. One island structure IS may correspond to one pixel PX, but not limited thereto. As shown in FIG. 1, one pixel PX may include a blue light emitting unit, two green light emitting units and a red light emitting unit, but not limited thereto.

The electronic device 1 may include a plurality of dams DM, and one of the dams DM may be disposed on one of two adjacent island structures IS or corresponding to one of two adjacent island structures IS, but not limited thereto. As shown in FIG. 1 and FIG. 2, one of the dams DM can be disposed on one of the island structures IS respectively, but not limited thereto. As shown in FIG. 2, the dams DM may be disposed on the insulating layer 114. As shown in FIG. 1, the dam DM may be continuous and closed and may surround the light emitting units LE, but not limited thereto. In some embodiments, the dam DM may not be closed or may be discontinuous, and the dam DM may be disposed on at least one side of the light emitting units LE. The dams DM may include organic insulating materials, inorganic insulating materials or combinations thereof, but not limited thereto.

Please refer to FIG. 3, FIG. 3 is an enlarged cross-sectional view schematic diagram of the dam according to the first embodiment of the present disclosure. FIG. 3 only shows the insulating layer 114, the dam DM and a trace 128 for illustration. In this embodiment, the trace 128 disposed on the insulating layer 114 can extend from outside the dam DM into the dam DM. At least a portion of the trace 128 may be covered by the dam DM. The trace 128 in the dam DM can climb along the side edge of the sub-layer in the dam DM, but not limited thereto. In addition, the traces 128 may include metal or other suitable conductive materials, but not limited thereto.

As shown in FIG. 2, the electronic device 1 may include an insulating layer IN disposed on the insulating layer 114 and the light emitting units LE. The insulating layer IN may be a single layer or a composite layer. For example, the insulating layer IN may include at least one sub-layer 116, but not limited thereto. In some embodiments (as shown in FIG. 2), the insulating layer IN may include a sub-layer 118, a sub-layer 120, a sub-layer 122 and a sub-layer 116, but not limited thereto.

Taking one of the island structures IS in FIG. 2 as an example, the sub-layer 118 may be disposed on the insulating layer 114, the light emitting unit LE and the dam DM, and the sub-layer 118 may at least cover the light emitting unit LE, the dam DM and area outside the dam DM. The sub-layer 118 may include an inorganic insulating material, but not limited thereto.

The sub-layer 116 may be disposed on the sub-layer 118, and the sub-layer 116 may include an organic insulating material, but not limited thereto. As shown in FIG. 1 and FIG. 2, the sub-layer 116 may be disposed in the dam DM and may at least cover the light emitting units LE. When forming the sub-layer 116, since the sub-layer 116 may include the organic insulating material and the organic insulating material may be flowable, the dam DM may be used to limit the range where the sub-layer 116 is formed.

The sub-layer 120 may be disposed on the sub-layer 116, thus the sub-layer 116 may be disposed between the sub-layer 118 and the sub-layer 120. The sub-layer 120 may at least cover the sub-layer 116, the dam DM and the area outside the dam DM, and the sub-layer 120 and the sub-layer 118 may be connected with each other in the area outside the sub-layer 116. The sub-layer 120 may include an inorganic insulating material, but not limited thereto.

The sub-layer 122 may be disposed on the sub-layer 120 and may at least cover the sub-layer 116, the dam DM and the area outside the dams DM. The sub-layer 122 may include an organic insulating material, but not limited thereto.

As shown in FIG. 2, the insulating layer IN (such as the sub-layer 116 therein) may include a part INa and a part INb. The part INa corresponds to one of two adjacent island structures IS (such as the island structure IS1), the part INb corresponds to another one of two adjacent island structures IS (such as the island structure IS2), and the part INb is separated from the part INa.

The electronic device 1 may include a sensing layer SM disposed on the insulating layer IN. As shown in FIG. 2, the sensing layer SM may be disposed on the sub-layer 122 of the insulating layer IN, but not limited thereto. The sensing layer SM may include a conductive material, but not limited thereto.

In some embodiments, the sensing layer SM may include a metal mesh structure, but not limited thereto. The sensing layer SM may have a plurality of mesh units MU. The mesh unit MU can be the range enclosed by the smallest unit. In some embodiments (as shown in FIG. 1), one of the mesh units MU may be disposed on the sub-layer 116 of the insulating layer IN on one of the island structures IS (such as the island structure IS2), but not limited thereto.

The mesh unit MU may have a mesh frame MUa and an opening MUb. The mesh frame MUa may include a plurality of grid branches, the grid branches may be connected with each other to form a frame surrounding the opening MUb, and the boundary of the mesh unit MU may be located on the grid branches of the mesh frame MUa. In this embodiment, the grid branches may form closed frames. In other embodiments, the grid branches may form unclosed frames, and the grid branches surrounding the same opening may have gaps.

At least one of the light emitting units LE may be disposed in the opening MUb. In some embodiments (as shown in FIG. 1), multiple light emitting units LE may be disposed in the opening MUb of one mesh unit MU, but not limited thereto.

In some embodiments (as shown in FIG. 2), the mesh frame MUa may overlap the part INb of the sub-layer 116 in the insulating layer IN, but not limited thereto. As shown in FIG. 1, the mesh frame MUa can be disposed inside the dam DM, but not limited thereto.

In some embodiments (as shown in FIG. 2), the sensing layer SM may overlap the dam DM. The sensing layer SM may include a part P1, a part P2, and a part P3. In the top view (as shown in FIG. 1), the part P1 and the part P3 may correspond to one of two adjacent island structures IS (such as the island structure IS1), the part P1 may be disposed between at least one light emitting unit LE and the dam DM, and the part P3 may be disposed between the dam DM and at least one bridge structure BR. In addition, a portion of the sensing layer SM disposed on the dam DM and overlap the dam DM may also belong to the part P1, and a portion of the sensing layer SM outside the dam DM may belong to the part P3. In some embodiments, the sensing layer SM on each of the island structures IS may respectively include the part P1 and the part P3.

The part P2 may correspond to at least one of the bridge structures BR (e.g., the bridge structure BR connecting the island structure IS1 and the island structure IS2). As shown in FIG. 1, the part P2 of the sensing layer SM on the bridge structure BR can be used to electrically connect the mesh unit MU on the island structure IS1 and the mesh unit MU on the island structure IS2. In some embodiments, the sensing layer SM on each of the bridge structures BR may respectively include the part P2.

As shown in FIG. 2, a height H1 is included between the part P1 of the sensing layer SM and the island structure IS1 (such as the one of two adjacent island structures IS), a height H2 is included between the part P2 of the sensing layer SM and the bridge structure BR, and a height H3 is included between the part P3 of the sensing layer SM and the island structure IS1. The height H1 may be greater than the height H2, and the height H3 may be greater than the height H2 and may be less than the height H1.

The height H1, the height H2 and the height H3 may be measured from the lower surface of the sensing layer SM to the upper surface SB1 of the substrate SB, but not limited thereto. The height H1, the height H2 and the height H3 may also be measured from the lower surface of the sensing layer SM to the same horizontal plane.

For example, the height H1, the height H2 and the height H3 respectively may be the maximum values measured in the cross-sectional view. For another example, the height H1, the height H2 and the height H3 may be measured in the same cross-sectional view having the island structure IS and the bridge structure BR. Alternatively, the height H1 and the height H3 may be measured in one cross-sectional view having the island structure IS, and the height H2 may be measured in another cross-sectional view having the bridge structure BR. Alternatively, the height H1 may be measured in one cross-sectional view having the island structure IS, the height H3 may be measured in another cross-sectional view having the island structure IS, and the height H2 may be measured in one cross-sectional view having the bridge structure BR.

In some embodiments, the difference between the height H1 and the height H2 may be greater than or equal to 10 micrometers and less than or equal to 20 micrometers, but not limited thereto. In some embodiments, the difference between the height H1 and the height H2 may be greater than or equal to 13 micrometers and less than or equal to 18 micrometers, but not limited thereto. For example, the height H1 may be 22.24 micrometers and the height H2 may be 7.1 micrometers, but not limited thereto.

When the ratio (H2/H1) of the height H2 to the height H1 is less than 0.1, cracks may occur in the bridge structure BR after stretching, and the electronic device 1 may be damaged. When the ratio is greater than 0.6, cracks may occur at the connection boundary between the bridge structure BR and the island structure IS after stretching, and the electronic device 1 may be damaged.

In some embodiments, the ratio (H2/H1) of the height H2 to the height H1 may be greater than or equal to 0.1 and less than or equal to 0.6, but not limited thereto. In this range of the ratio, the damage rate of the electronic device 1 after 1000 times of stretching can be less than 5%. In some embodiments, the ratio of the height H2 to the height H1 may be greater than or equal to 0.2 and less than or equal to 0.5, but not limited thereto. In this range of the ratio, the damage rate of the electronic device 1 after 1000 times of stretching can be less than 10%.

A distance D1 between an edge of the dam DM and an edge of one of two adjacent island structures IS (such as the island structure IS1) may be greater than 0. In some embodiments, the distance D1 may be greater than or equal to 1 micrometer and less than or equal to 20 micrometers, but not limited thereto. As shown in FIG. 1, the distance D1 can be measured from the outermost edge of the dam DM to the outermost edge of the island structure IS1. As shown in FIG. 2, the distance D1 can be measured from the edge of the bottom surface of the dam DM to the edge of the island structure IS1.

As shown in FIG. 2, the insulating layer 114 may have a part Q1 and a part Q2. The part Q1 may be disposed between one of two adjacent island structures IS (such as the island structure IS1) and the part INa of the insulating layer IN. The part Q2 may be disposed on another one of two adjacent island structures IS (such as the island structure IS2) and may be disposed between the island structure IS2 and the part INb of the insulating layer IN. As shown in FIG. 1, the electronic device 1 may include a plurality of recesses RD. As shown in FIG. 2, the recess RD may separate the part Q1 and the part Q2 of the insulating layer 114, and the recess RD may be disposed on the bridge structure BR.

In some embodiments, the recesses RD may be formed by at least one insulating layer or disposed in at least one insulating layer. In the present disclosure, the recesses may penetrate through a portion of the insulating layer or completely penetrate through the insulating layer. As shown in FIG. 2, the recess RD may penetrate through the sub-layer 118 and the sub-layer 120 of the insulating layer IN, the insulating layer 114 and at least a portion of the insulating layer 112, but not limited thereto.

As shown in FIG. 2, the edges of the sub-layer 118 and the sub-layer 120 of the insulating layer IN, the edge of the insulating layer 114 and the edge of at least a portion of the insulating layer 112 adjacent to the recess RD or used to form the recess RD may be curved edges. In some embodiments, the curved edges of the sub-layer 118 and the sub-layer 120 of the insulating layer IN, the curved edge of the insulating layer 114 and the curved edge of at least a portion of the insulating layer 112 may form a stepped structure, but not limited thereto.

The sensing layer SM (such as the part P1, the part P2 and the part P3) can extend from the island structure IS (such as the island structure IS1 or the island structure IS2) to the bridge structure BR, and the sensing layer SM (such as the part P3) can extend into the recess RD, thus the sensing layer SM can cover the edges of two organic insulating layers (such as the insulating layer 114 and the insulating layer 112). In some embodiments, the sensing layer SM may cover the curved edges of the sub-layer 118 and the sub-layer 120 of the insulating layer IN, the curved edge of the insulating layer 114 and the curved edge of at least a portion of the insulating layer 112, but not limited thereto. By this structural design, the possibility of breaking the sensing layer SM can be reduced.

Taking the insulating layer 114 as an example, the insulating layer 114 may have a thickness Ha (such as the maximum thickness), the edge of the insulating layer 114 used to form the recess RD may have a point Q, and the point Q may correspond to the position of two thirds of the thickness Ha. A virtual line VL1 may pass through the point Q and the bottom end of the edge of the insulating layer 114. An angle $\alpha$ between the virtual line VL1 and the bottom surface of the insulating layer 114 may represent the slope of the edge of the insulating layer 114 or the slope of the recess RD. This definition may also be used to calculate the slopes of the edges of other layers or the slopes of other recesses. For example, the angle $\alpha$ may be greater than or equal to 80 degrees and less than 90 degrees, but not limited thereto. When the angle $\alpha$ is within this range, the chance of the sensing layer SM descending steeply in the structure can be reduced.

In some embodiments of the present disclosure, the technical features of forming the dam DM and separating the edge of the dam DM and the edge of the island structure IS1 by the distance D1, and the curved edge design of the edges of the insulating layers adjacent to the recess RD can have the advantageous functions such as reducing the chance of the sensing layer SM descending steeply in the structure, reducing the possibility of breaking the sensing layer SM. Therefore, the reliability of the stretchable electronic device can be improved.

As shown in FIG. 2, the electronic device 1 may include a sensing layer SN disposed between the sub-layer 122 and the sub-layer 120 of the insulating layer IN. The sensing layer SN may include a conductive material, but not limited thereto. In some embodiments, the sensing layer SN may also include a metal mesh structure and have a plurality of mesh units, but not limited thereto.

In some embodiments, the sensing layer SM may be one of the transmitter (Tx) electrodes and the receiver (Rx) electrodes of the touch sensing device, and the sensing layer SN may be the other one of the transmitter electrodes and the receiver electrodes, but not limited thereto. The sensing layer SM and the sensing layer SN can be applied to a touch sensing component, a pensensor, an antenna, other suitable sensing components or combinations thereof, but not limited thereto.

In some embodiments, a first part of the sensing layer SM may be used as one of the transmitter electrodes and the receiver electrodes, and a second part of the sensing layer SM may be used as the other one of the transmitter electrodes and the receiver electrodes. The sensing layer SN may include a plurality of bridge electrodes used for connecting the transmitter electrodes or the receiver electrodes and may transmit signals of the transmitter electrodes or the receiver electrodes.

As shown in FIG. 2, the electronic device 1 may include an insulating layer 124 disposed on the insulating layer IN and the sensing layer SM, and the insulating layer 124 may be used as a protective layer. The insulating layer 124 may include a waterproof material, and the insulating layer 124 may for example include an organic insulating material, but not limited thereto.

The following will continue to disclose other embodiments of the present disclosure. However, in order to simplify the description and highlight the differences between the embodiments, the same reference numerals are used to denote the same elements hereinafter, the differences between different embodiments are described in detail, and the repeated portions will not be described again. In addition, the electronic devices of the following embodiments can achieve the effects of reducing the possibility of breaking the sensing layer and improving the reliability of the electronic devices.

Figure 4:
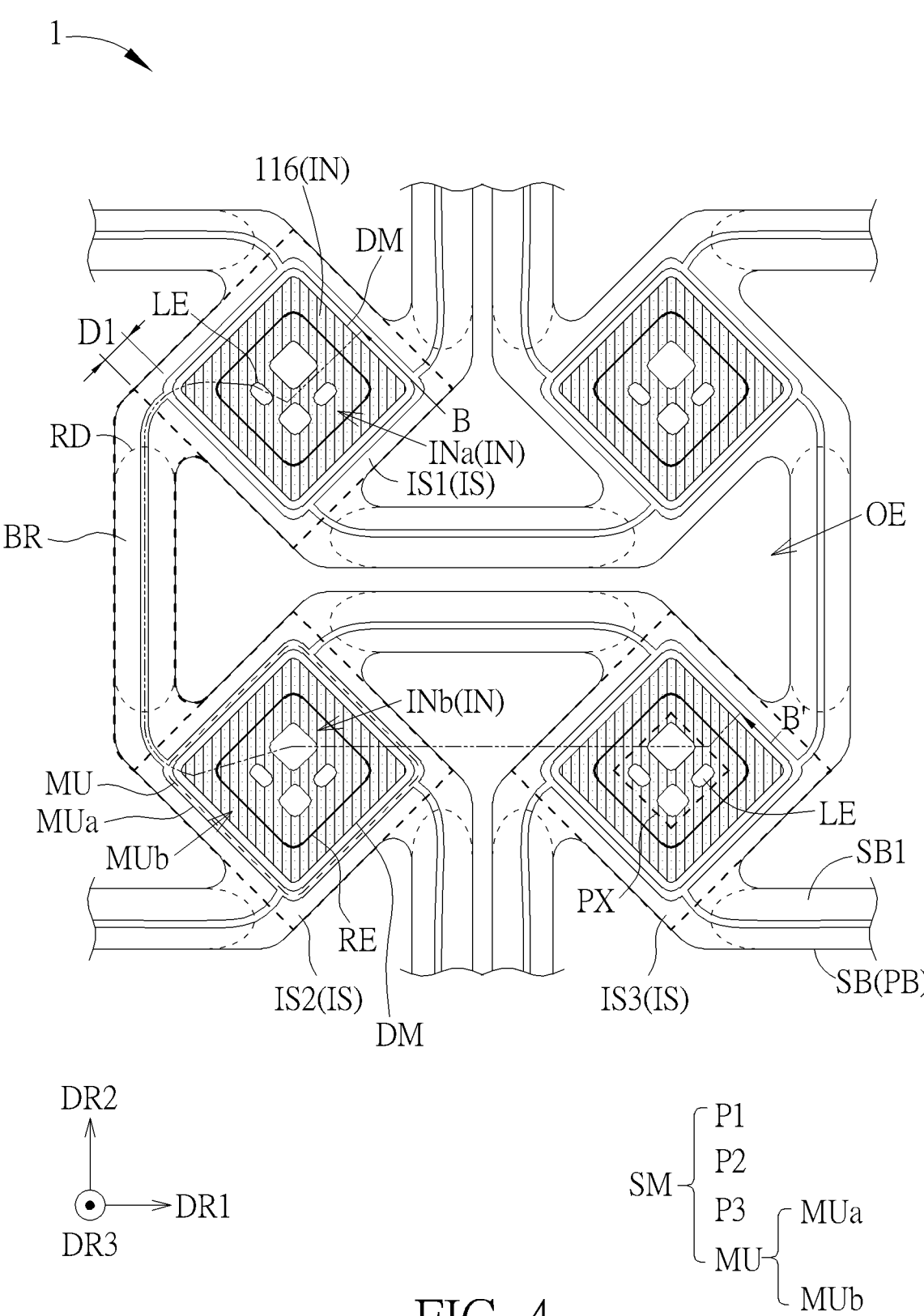
FIG. 4 is a partially enlarged top view schematic diagram of an electronic device according to a second embodiment of the present disclosure.
Figure 5:
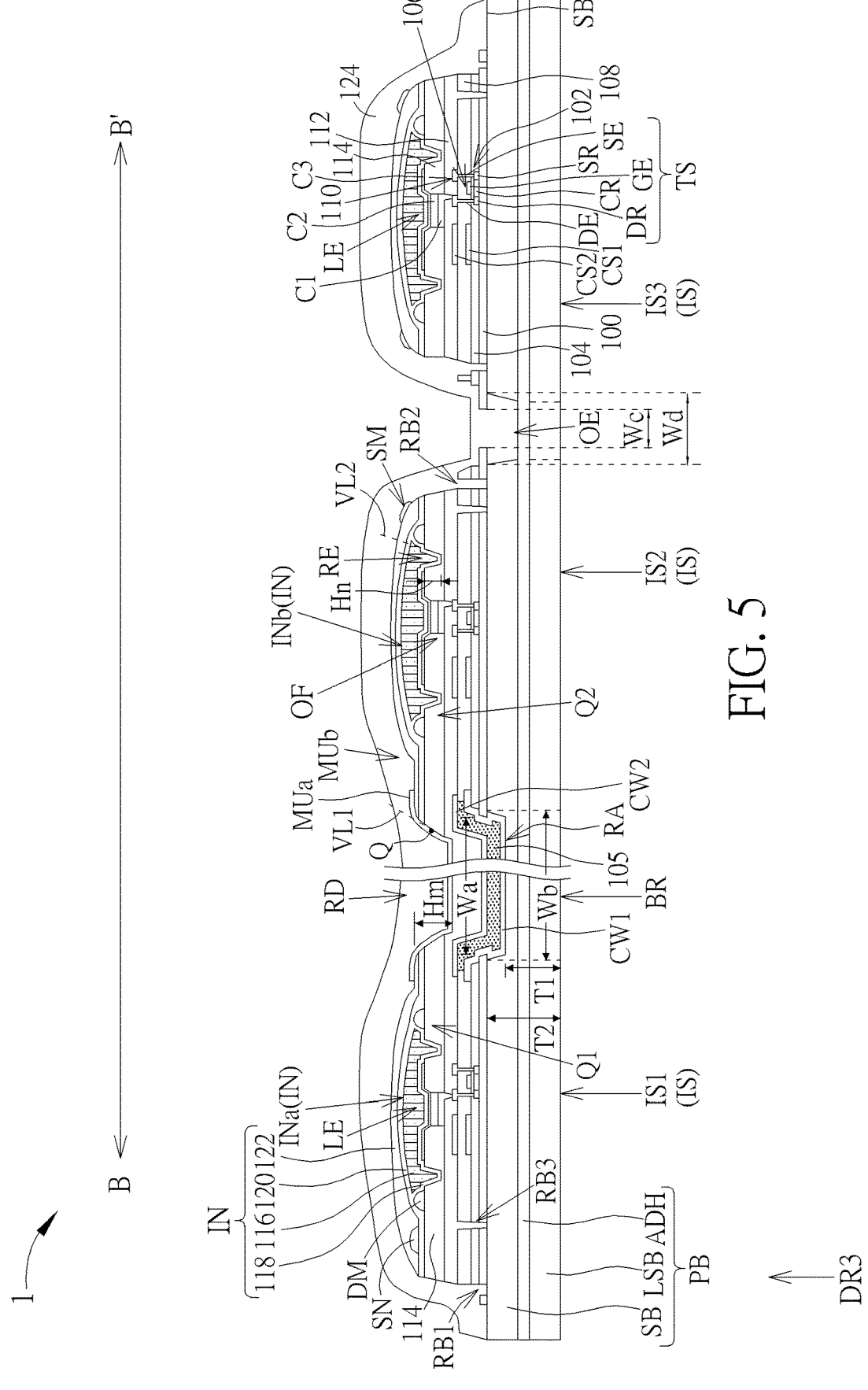
FIG. 5 is a cross-sectional view schematic diagram of the electronic device corresponding to the line B-B' in FIG. 4 of the second embodiment of the present disclosure.

Please refer to FIG. 4 and FIG. 5. FIG. 4 is a partially enlarged top view schematic diagram of an electronic device according to a second embodiment of the present disclosure. FIG. 5 is a cross-sectional view schematic diagram of the electronic device corresponding to the line B-B' in FIG. 4 of the second embodiment of the present disclosure. In some embodiments (as shown in FIG. 4), the mesh frame MUa may be disposed outside the part INb of the sub-layer 116 in the insulating layer IN, thus the mesh frame MUa may not overlap the sub-layer 116. It is noteworthy that the insulating layer IN can be the composite layer, and the mesh frame MUa can be disposed outside the part INb of the sub-layer 116, which also means that the mesh frame MUa can be disposed outside the insulating layer IN. As shown in FIG. 5, the dam DM can be disposed in the mesh frame MUa.

The electronic device 1 may include a plurality of recesses RE. As shown in FIG. 4, one recess RE can be disposed on each of the island structures IS, and the recess RE can be disposed between the dam DM and the light emitting units LE, but not limited thereto. The recess RE may be continuous and closed and may surround the light emitting units LE, but not limited thereto. In some embodiments, the recess RE may not be closed or may be discontinuous and may be disposed on at least one side of the light emitting units LE.

As shown in FIG. 5, the recesses RE may be formed by the insulating layer 114 or disposed in the insulating layer 114, the recesses RE may be overlapped with the sub-layer 116 (i.e., the part INa and the part INb in the insulating layer IN), the sub-layer 118 may extend into the recesses RE, and the sub-layer 116 may be filled in the recesses RE. The design of the recesses RE can reduce the possibility that the organic material of the sub-layer 116 flows out of the dam DM during the fabrication.

Through the definition of slope described in the first embodiment, the edge of the insulating layer 114 used for forming the recess RD may have the virtual line VL1, and the edge of the insulating layer 114 used for forming the recess RE may have a virtual line VL2. The slope of the virtual line VL1 may represent the slope of the recess RD, the slope of the virtual line VL2 may represent the slope of the recess RE, and the slope of the recess RD may be different from the slope of the recess RE. For example, the slope of the recess RD may be less than the slope of the recess RE. Since the slope of the recess RD is small, the possibility of breaking the sensing layer SM can be reduced.

As shown in FIG. 5, the depth Hm of the recess RD may be greater than the depth Hn of the recess RE. Since the depth Hm of the recess RD is large, a portion of the sensing layer SM extending into the recess RD can be closer to the conductive layer 106 (such as the conductive wire CW1) and the conductive layer 110 (such as the conductive wire CW2), and this can reduce the difficulty of adjusting the position of the stress neutral layer, thereby reducing the possibility that the layers on the bridge structure BR may be damaged due to deformation.

The edges of the sub-layer 122, the sub-layer 118 and the sub-layer 120 of the insulating layer IN, the edge of the insulating layer 114 and the edge of at least a portion of the insulating layer 112 adjacent to the recess RD may be curved edges. In this embodiment, the curved edges of the sub-layer 122, the sub-layer 118 and the sub-layer 120 of the insulating layer IN, the curved edge of the insulating layer 114 and the curved edge of at least a portion of the insulating layer 112 may together form a curved edge and may not include the stepped structure in the first embodiment, but not limited thereto.

In this embodiment, a portion of the substrate SB in the bridge structure BR, a portion of the buffer layer 100, a portion of the insulating layer 104 and a portion of the insulating layer 108 disposed on the bridge structure BR can be removed or thinned, and the portion of the substrate SB, the portion of the buffer layer 100 and the portion of the insulating layer 104 can be removed to form the recess RA. The recess RA may penetrate through the insulating layer 104 and the buffer layer 100, and the recess RA may not completely penetrate through the substrate SB but only penetrate through a portion of the substrate SB, but not limited thereto.

Therefore, the thickness T1 of the bridge structure BR may be less than the thickness T2 of the island structure IS, but not limited thereto. Through the above thickness design, the island structures IS can provide sufficient support and the stretchability of the bridge structures BR can also be improved. The method of measuring the thicknesses of the bridge structures BR and the island structures IS can be as follows: firstly, the bridge structure BR and the island structure IS of the patterned substrate PB respectively can be divided into left part, middle part and right part, and then the thickness of the middle part of the bridge structure BR can be measured as the thickness T1, and the thickness of the middle part of the island structure IS can be measured as the thickness T2.

The buffer layer 100 has an opening at the location of the recess RA, and the opening has a width Wa. The substrate SB has an opening at the location of the recess RA, and the opening has a width Wb. The width Wa of the buffer layer 100 can be less than the width Wb of the substrate SB, thus the buffer layer 100 can protect the edge of the substrate SB below. The width Wa may be the maximum width of the opening of the buffer layer 100, and the width Wb may be the maximum width of the opening of the substrate SB.

In addition, the buffer layer 100 has an opening at the location of the opening OE, and the opening has a width Wc. The substrate SB has an opening at the location of the opening OE, and the opening has a width Wd. The width Wc of the buffer layer 100 may be less than the width Wd of the substrate SB. The width Wc may be the maximum width of the opening of the buffer layer 100, and the width Wd may be the maximum width of the opening of the substrate SB.

Figure 6:
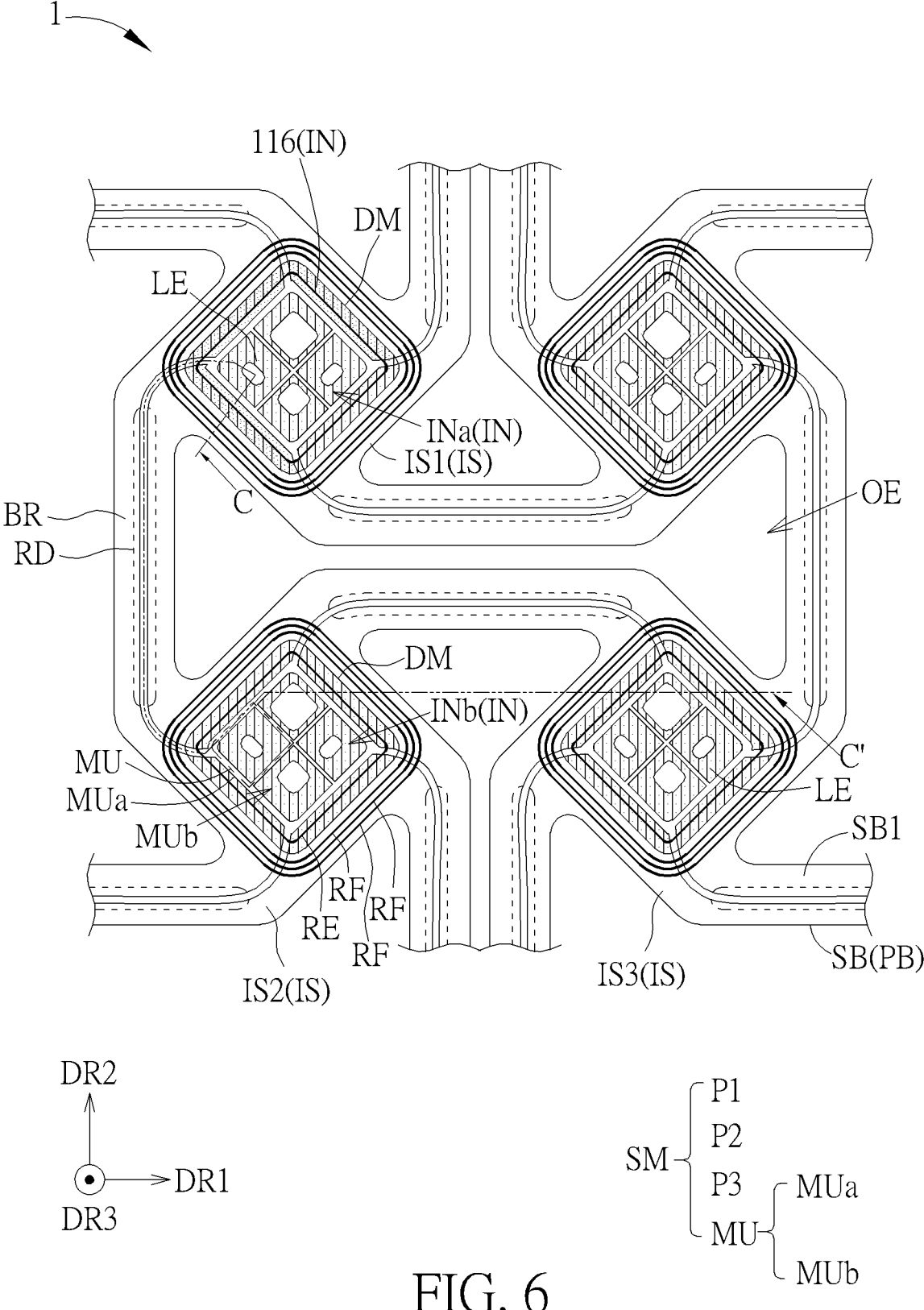
FIG. 6 is a partially enlarged top view schematic diagram of an electronic device according to a third embodiment of the present disclosure.
Figure 7:
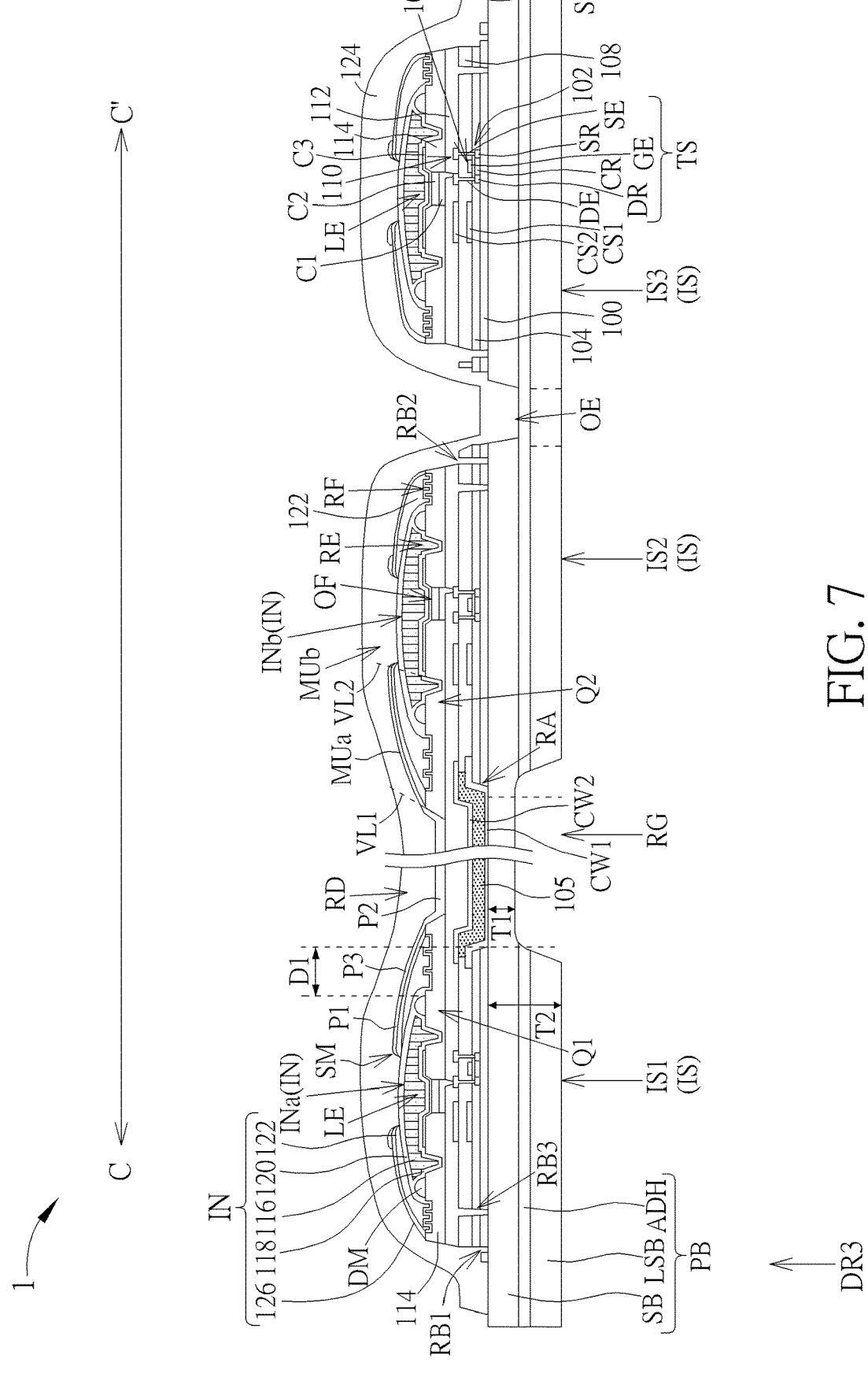
FIG. 7 is a cross-sectional view schematic diagram of the electronic device corresponding to the line C-C' in FIG. 6 of the third embodiment of the present disclosure.

Please refer to FIG. 6 and FIG. 7. FIG. 6 is a partially enlarged top view schematic diagram of an electronic device according to a third embodiment of the present disclosure. FIG. 7 is a cross-sectional view schematic diagram of the electronic device corresponding to the line C-C' in FIG. 6 of the third embodiment of the present disclosure. In this embodiment, one light emitting unit LE can be disposed in the opening MUb of one mesh unit MU, but not limited thereto. As shown in FIG. 6, four light emitting units LE and four mesh units MU may be disposed on one island structure IS, and the mesh units MU can be connected with each other, but not limited thereto.

The electronic device 1 may include a plurality of recesses RF. As shown in FIG. 6, three recesses RF can be disposed on each of the island structures IS, and the recesses RF can be disposed outside the dams DM, but the number of recesses RF is not limited thereto. As shown in FIG. 7, the recesses RF may be formed by the insulating layer 114 or disposed in the insulating layer 114, and the recesses RF may penetrate through a portion of the insulating layer 114. The sub-layer 118 and the sub-layer 120 may extend into the recesses RF, and the sub-layer 122 may be filled in the recesses RF, but not limited thereto.

The insulating layer IN may include a sub-layer 126, the sub-layer 126 may be disposed on the sub-layer 122, and the sensing layer SM may be disposed on the sub-layer 126, but not limited thereto. The sub-layer 126 may include an inorganic insulating material, but not limited thereto. The recesses RF and the sub-layer 118, the sub-layer 120, the sub-layer 122 and the sub-layer 126 on the recesses RF can improve the effect of blocking water and oxygen.

In addition, the sub-layer 122 and the sub-layer 126 may not cover the light emitting units LE, in other words, the sub-layer 122 and the sub-layer 126 may have openings disposed on the light emitting units LE, but not limited thereto. The upper surfaces of the sub-layer 122 and the sub-layer 126 can be curved surfaces, the sensing layer SM can extend into the recess RD gently, and the possibility of breaking the sensing layer SM can be reduced.

The electronic device 1 may include at least one recess RG. As shown in FIG. 7, one recess RG may be at least disposed in one bridge structure BR of the patterned substrate PB. The recess RG may penetrate through the substrate LSB, the adhesive layer ADH and a portion of the substrate SB, but not limited thereto. Therefore, the thickness T1 of the bridge structure BR may be less than the thickness T2 of the island structure IS.

As shown in FIG. 7, the edge of the insulating layer 114 adjacent to the recess RD or used to form the recess RD may be an inclined edge. The edges of other insulating layers adjacent to the recess RD or used to form the recess RD can also be inclined edges, and they can be connected with each other to form a long inclined edge, but not limited thereto.

Figure 8:
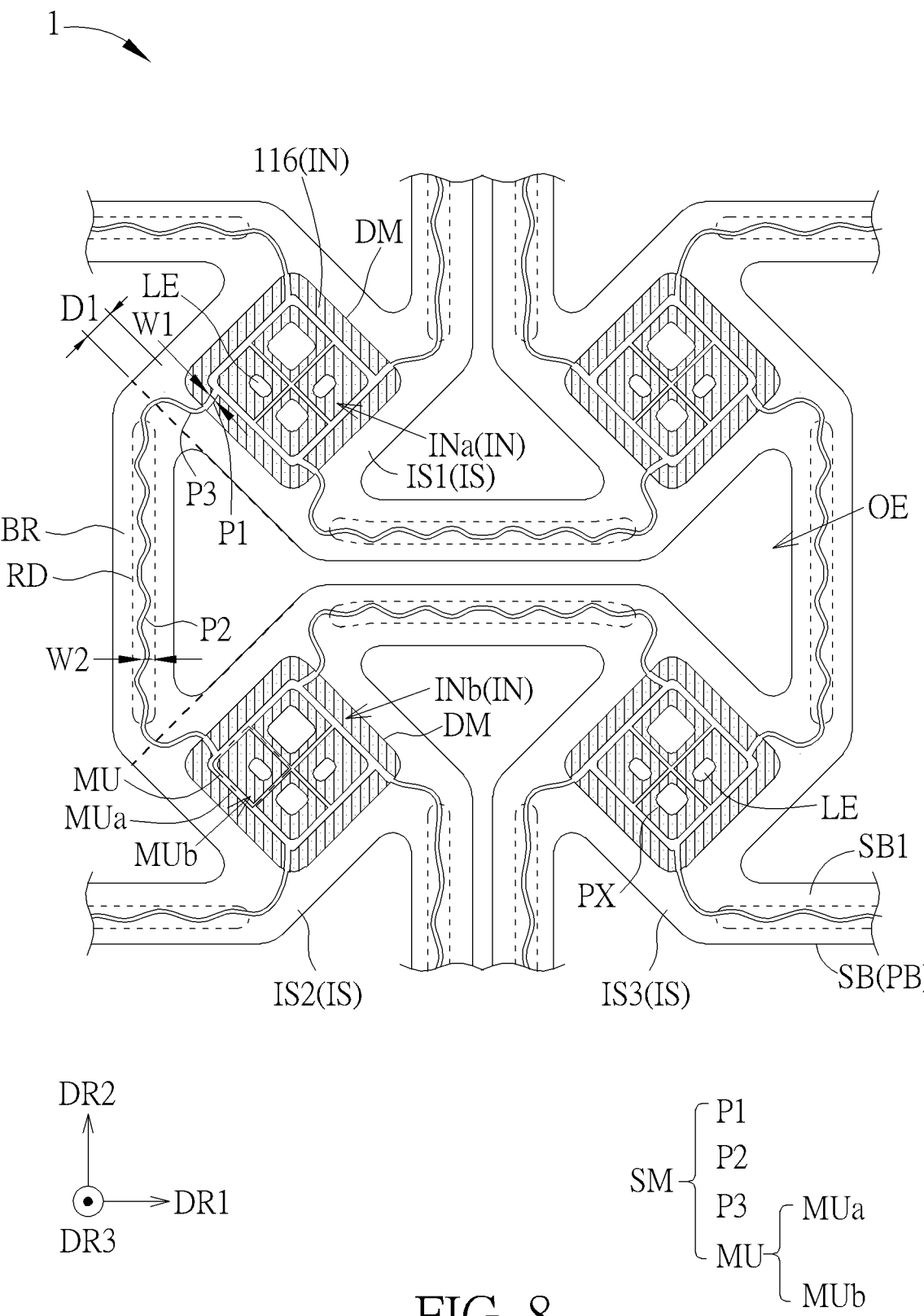
FIG. 8 is a partially enlarged top view schematic diagram of an electronic device according to a fourth embodiment of the present disclosure.

Please refer to FIG. 8, FIG. 8 is a partially enlarged top view schematic diagram of an electronic device according to a fourth embodiment of the present disclosure. In this embodiment, the part P1 of the sensing layer SM has a first width W1, and the part P2 of the sensing layer SM has a second width W2, and the width W1 may be greater than the width W2. The width of the sensing layer SM may be the width of a sensing line segment measured along a perpendicular direction in the top view, and the perpendicular direction may be perpendicular to the extending direction of the sensing line segment.

Please refer to FIG. 2 again, since the height H1 between the part P1 of the sensing layer SM and the island structure IS may be greater than the height H2 between the part P2 of the sensing layer SM and the bridge structure BR, the part P1 may be higher than the part P2. Therefore, in this embodiment, the width of the sensing layer SM located at the higher place may be greater than the width of the sensing layer SM located at the lower place. The sensing effect of different regions can be adjusted by designing the conductive wires or electrodes of the sensing layer SM with different widths, thereby improving the uniformity of the overall sensing effect.

As shown in FIG. 8, the conductive wires outside the mesh frames MUa, such as the parts P1, the parts P2 and the parts P3 of the sensing layer SM, may be bent wires or irregularly shaped wires, but not limited thereto.

Figure 9:
FIG. 9 is a partially enlarged top view schematic diagram of a sensing layer SM and a sensing layer SN in an electronic device according to a fifth embodiment of the present disclosure.
Figure 9:
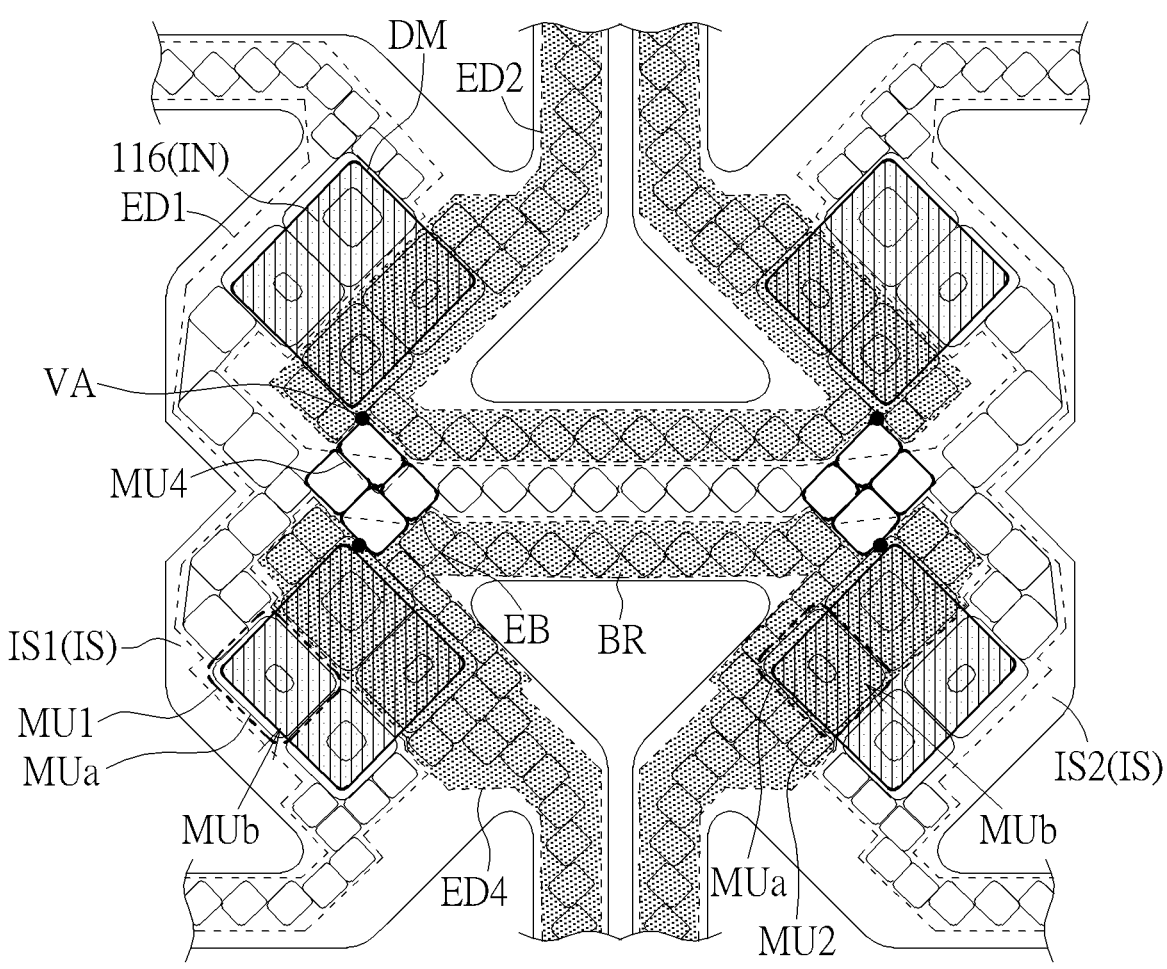
Figure 9:
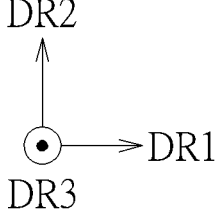
Figure 10:
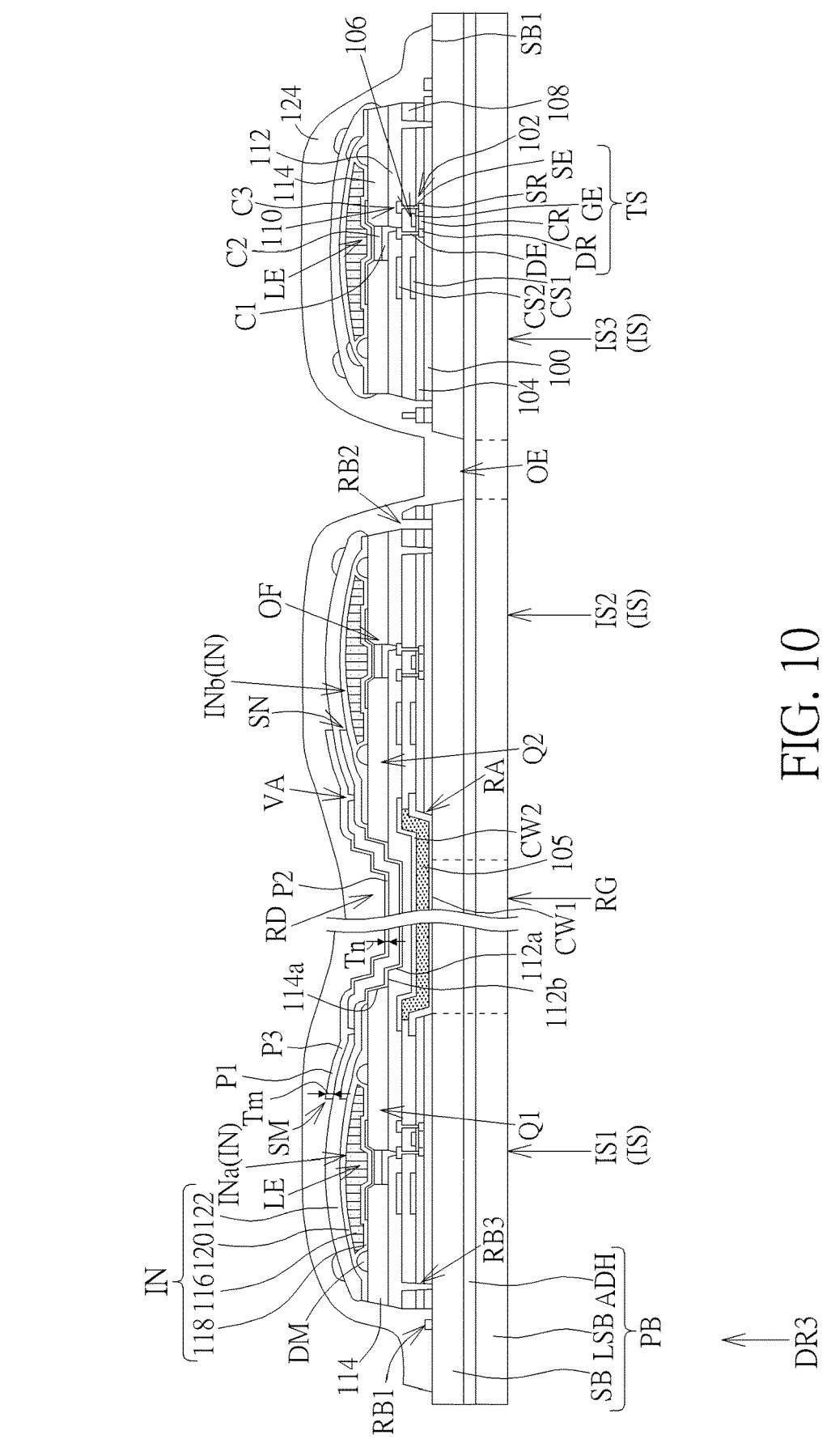
FIG. 10 is a cross-sectional view schematic diagram of the electronic device according to the fifth embodiment of the present disclosure.

Please refer to FIG. 9 and FIG. 10. FIG. 9 is a partially enlarged top view schematic diagram of a sensing layer SM and a sensing layer SN in an electronic device according to a fifth embodiment of the present disclosure. FIG. 10 is a cross-sectional view schematic diagram of the electronic device according to the fifth embodiment of the present disclosure. The electronic device 1 may include a plurality of transmitter electrode strings and a plurality of receiver electrode strings, and the transmitter electrode strings and the receiver electrode strings may be electrically insulated. As shown in FIG. 9, one of the transmitter electrode strings and the receiver electrode strings may include an electrode ED1, and the other one of the transmitter electrode strings and the receiver electrode strings may include an electrode ED2 and an electrode ED4, but the number of the electrodes is not limited thereto. The electrode ED2 and the electrode ED4 may be disposed in the direction DR2 and electrically connected to each other through at least one bridge electrode EB, but not limited thereto.

The sensing layer SM in FIG. 10 may include the electrode ED1, the electrode ED2 and the electrode ED4 in FIG. 9, and the sensing layer SN in FIG. 10 may include the bridge electrodes EB in FIG. 9, but not limited thereto.

The transmitter electrode strings and the receiver electrode strings may include a plurality of mesh units. The electrode ED1 may include a plurality of mesh units MU1 connected to each other, the electrode ED2 and the electrode ED4 may include a plurality of mesh units MU2 connected to each other, and the bridge electrodes EB may include a plurality of mesh units MU4 connected to each other.

Taking the mesh units MU1 of the electrode ED1 as an example, the grid branches of the mesh frames MUa of two adjacent mesh units MU1 can be connected with each other, and the boundary of one of the mesh units MU1 can be located between two adjacent openings MUb and located on the grid branch of the mesh frame MUa. In some of the mesh units MU1 and the mesh units MU2 in this embodiment, one light emitting unit LE can be disposed in one opening MUb, but not limited thereto.

As shown in FIG. 9, the electronic device 1 may include a plurality of contact holes VA, and the mesh frames MUa of the mesh units MU2 of the electrode ED2 and the electrode ED4 may be electrically connected to the mesh frames MUa of the mesh units MU4 of the bridge electrodes EB through the contact holes VA.

As shown in FIG. 10, the sensing layer SN, the sub-layer 122 and the sensing layer SM may extend from the island structures IS to the bridge structure BR and may extend into the recess RD. The contact holes VA may be formed by the sub-layer 122 or disposed in the sub-layer 122, and the contact holes VA may expose portions of the surface of the sensing layer SN. The sensing layer SM can be filled into the contact holes VA and can be electrically connected to the sensing layer SN. In addition, the contact holes VA can be disposed on the island structures IS. Since the island structures IS can have larger space, the contact holes VA can also have larger sizes, thereby reducing the contact resistance.

The part P1 of the sensing layer SM has a thickness Tm, and the part P2 of the sensing layer SM has a thickness Tn, and the thickness Tm may be different from the thickness Tn. For example, the thickness Tm may be greater than the thickness Tn. In the cross-sectional view, the thickness of the part P1 measured at a position corresponding to the maximum height in the part P1 may be the thickness Tm, and the thickness of the part P2 measured at a position corresponding to the minimum height in the part P2 may be the thickness Tn. The sensing layer SN may also have the above thickness characteristics.

The distance between the sensing layer and the finger may be different when the sensing layer locates at different heights, which makes the sensing sensitivity may be different at different positions. The sensitivity difference can be compensated by adjusting the thickness of the sensing layer at different heights, thereby improving the sensing quality.

As shown in FIG. 2, the edges of the sub-layer 118 and the sub-layer 120 of the insulating layer IN, the edge of the insulating layer 114 and at least a portion of the edge of the insulating layer 112 adjacent to the recess RD or used to form the recess RD may form the stepped structure, but not limited thereto. The possibility of breaking the sensing layer SM can be reduced by this design.

Taking the insulating layer 114 and the insulating layer 112 as an example, the insulating layer 112 may include a side edge 112*a* and a top edge 112*b*, the insulating layer 114 may include a side edge 114*a*, and the top edge 112*b* may be disposed between the side edge 112*a* and the side edge 114*a*. The side edge 112*a* and the side edge 114*a* may be the inclined edges, and the side edge 112*a* and the top edge 112*b* of the insulating layer 112 and the side edge 114*a* of the insulating layer 114 may form the stepped structure, but not limited thereto. The edges of the sub-layer 118 and the sub-layer 120 of the insulating layer IN adjacent to the recess RD may also have characteristics similar to those described above. In some embodiments, the side edge 112*a* and the side edge 114*a* may be connected with each other to form a long inclined edge.

To sum up, in the electronic device and the display device of the present disclosure, the dams may be disposed on the island structures and the edge of the dam and the edge of the island structure may be separated by a distance. In addition, the height between the sensing layer and the island structure may be greater than the height between the sensing layer and the bridge structure. These technical features can have the advantageous functions such as reducing the chance of the sensing layer descending steeply in the structure and reducing the possibility of breaking the sensing layer. Therefore, the reliability of the electronic device and the display device can be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a patterned substrate having a plurality of island structures and a plurality of bridge structures, wherein at least one of the bridge structures connects two adjacent ones of the island structures;
    a plurality of light emitting units, wherein at least one of the light emitting units is disposed on one of the two adjacent ones of the island structures;
    a first insulating layer disposed on the light emitting units; and
    a sensing layer disposed on the first insulating layer and having a mesh unit, wherein the mesh unit has a mesh frame and an opening, and the at least one of the light emitting units is disposed in the opening;
    wherein the sensing layer has a first part corresponding to the one of the two adjacent ones of the island structures and a second part corresponding to the at least one of the bridge structures, and a first height between the first part of the sensing layer and the one of the two adjacent ones of the island structures is greater than a second height between the second part of the sensing layer and the at least one of the bridge structures.

2. The display device of claim 1, wherein the first insulating layer has a first part corresponding to the one of the two adjacent ones of the island structures and a second part corresponding to another one of the two adjacent ones of the island structures, and the second part of the first insulating layer is separated from the first part of the first insulating layer.

3. The display device of claim 2, wherein the mesh frame is disposed outside the first part of the first insulating layer.

4. The display device of claim 2, wherein the mesh frame overlaps the first part of the first insulating layer.

5. The display device of claim 1, wherein a difference between the first height and the second height is greater than or equal to 10 micrometers and less than or equal to 20 um.

6. The display device of claim 1, wherein a ratio of the second height to the first height is greater than or equal to 0.1 and less than or equal to 0.6.

7. The display device of claim 1, wherein the first part of the sensing layer has a first thickness and the second part of the sensing layer has a second thickness, and the first thickness is greater than the second thickness.

8. The display device of claim 1, wherein the first part of the sensing layer has a first width and the second part of the sensing layer has a second width, and the first width is greater than the second width.

9. The display device of claim 1, further comprising a dam disposed on the one of the two adjacent ones of the island structures, wherein the sensing layer has a third part corresponding to the one of the two adjacent ones of the island structures;
    wherein in a top view of the display device, the first part of the sensing layer is disposed between the at least one of the light emitting units and the dam, and the third part of the sensing layer is disposed between the dam and the at least one of the bridge structures; and
    wherein a third height between the third part of the sensing layer and the one of the two adjacent ones of the island structures is greater than the second height and less than the first height.

10. The display device of claim 1, further comprising a dam corresponding to one of the two adjacent ones of the island structures, wherein the sensing layer overlaps the dam.

11. The display device of claim 10, wherein a distance between an edge of the dam and an edge of the one of the two adjacent ones of the island structures is greater than 0 micrometers.

12. The display device of claim 11, wherein the distance is greater than or equal to 1 micrometer and less than or equal to 20 micrometers.

13. The display device of claim 1, further comprising:
    a second insulating layer having a first part and a second part, wherein the first part of the second insulating layer is disposed between the one of the two adjacent ones of the island structures and the first insulating layer, and the second part of the second insulating layer is disposed on another one of the two adjacent ones of the island structures;
    a first recess separating the first part of the second insulating layer and the second part of the second insulating layer; and
    a second recess disposed in the second insulating layer, wherein a slope of the first recess is different from a slope of the second recess.

14. The display device of claim 13, wherein the second insulating layer is a pixel defining layer.

15. The display device of claim 1, wherein the at least one of the bridge structures is stretchable.

16. The display device of claim 1, wherein a thickness of the at least one of the bridge structures is less than a thickness of the one of the two adjacent ones of the island structure.

* * * * *